(12) United States Patent
Liu et al.

(10) Patent No.: US 7,728,945 B2
(45) Date of Patent: Jun. 1, 2010

(54) STRUCTURE FOR CIRCUIT ASSEMBLY

(75) Inventors: Po-Yuan Liu, Hsinchu (TW);
Chuan-Mau Wei, Hsinchu Hsien (TW);
Chih-Yuan Chien, Taipei (TW)

(73) Assignee: Au Optronics Corp., Hsinchu-Chu (TW)

( * ) Notice: Subject to any disclaimer, the term of this patent is extended or adjusted under 35 U.S.C. 154(b) by 526 days.

(21) Appl. No.: 11/505,344

(22) Filed: Aug. 17, 2006

(65) Prior Publication Data
US 2007/0040286 A1 Feb. 22, 2007

(30) Foreign Application Priority Data
Aug. 17, 2005 (TW) ............... 94128091 A

(51) Int. Cl.
*H01L 23/544* (2006.01)
(52) U.S. Cl. ............ 349/149; 349/139; 349/150; 257/59; 257/797
(58) Field of Classification Search ............ 257/59, 257/797, E21.514, E23.179; 361/803, 802, 361/749; 349/150, 152; 29/830
See application file for complete search history.

(56) References Cited

U.S. PATENT DOCUMENTS

| | | | | |
|---|---|---|---|---|
| 5,404,239 A | * | 4/1995 | Hirai | 349/150 |
| 5,982,468 A | * | 11/1999 | Satou et al. | 349/150 |
| 6,683,594 B1 | | 1/2004 | Mori et al. | |
| 6,744,638 B2 | * | 6/2004 | Terasaka | 361/803 |
| 7,339,646 B2 | * | 3/2008 | Izawa et al. | 349/150 |
| 7,403,257 B2 | * | 7/2008 | Shin et al. | 349/152 |
| 2004/0156006 A1 | * | 8/2004 | Uehara | 349/145 |
| 2005/0099565 A1 | * | 5/2005 | Shin et al. | 349/139 |
| 2006/0141744 A1 | * | 6/2006 | Best et al. | 438/455 |

FOREIGN PATENT DOCUMENTS

| | | |
|---|---|---|
| EP | 0 738 998 A1 | 10/1996 |
| JP | WO2004/044966 * | 5/2004 |
| TW | 460095 B | 10/2001 |
| TW | 496113 B | 7/2002 |

* cited by examiner

*Primary Examiner*—Leonardo Andújar
*Assistant Examiner*—William Harriston
(74) *Attorney, Agent, or Firm*—Birch, Stewart, Kolasch & Birch, LLP

(57) ABSTRACT

A structure for circuit assembly is applied to positional alignment in bonding process. The structure for circuit assembly comprises a first substrate, having a plurality of first terminals and both a first alignment mark and a second alignment mark located in the vicinity of the first terminals, and a second substrate, having a plurality of second terminals and a transmissive area located in the vicinity of second terminals. During the first substrate bonding with the second substrate, as the edge of the transmissive area is located between the first alignment mark and the second alignment mark, and the first alignment mark is outside of the transmissive area, the first terminals are normally connected with the second terminals.

17 Claims, 10 Drawing Sheets

STRUCTURE FOR CIRCUIT ASSEMBLY

BACKGROUND OF THE INVENTION (1) Field of the Invention

The invention relates to a structure for circuit assembly, specifically to such a structure which is used for circuit assembly of a display apparatus.

(2) Description of the Prior Art

Assembly for display normally uses the technology of tape automated bonding (TAB) or of chip on glass bonding (COG), and so on. Compared to TAB, COG uses less amount of flexible circuit boards and printed circuit boards, and thereby can reduce the production cost.

For further reducing the demand of the amount of flexible circuit boards and the layers of printed circuit board to gain more cost benefit, those products using the technology of COG also apply the wiring-on-array (WOA) on array substrate to cascade driver chips. Among the cascaded driver chips, data and control signals are transmitted only to the first driver chip, and thereafter they can be delivered to the other cascaded driver chips. As a result, the amount of wiring on the flexible circuit board and printed circuit board can be reduced, and the cost can be further decreased. Because driver chips are cascaded with the WOA on the array substrate, thereby simplifying the design for printed circuit board and reducing the number of layers of circuit board can lead to further cost down.

Because function of signals on gate drivers is less than those on source drivers, the number of connections required for gate drivers is relatively limited. It thus makes it easier to design the peripheral layout surrounding the display area and the arrangement of bonding pads to the design with cascade. For the cost-down requirement today, an attempt to cascade source drivers has become a dedicated approach field in the panel manufacture. While there are a number of function of signals on the source drivers, the flexibility of design for the peripheral layout will be restricted by the limit of size of a flip-chip; moreover, it has increased the difficulty to be compatible with the present process, such as using the same testing method, module tools, and so on. Therefore, how to improve the design of WOA on the array substrate so as to further reduce the cost of components on panel has become a request to achieve in the panel manufacture.

Refer to FIG. 1A, showing a conventional display. A panel 10 comprises a display area 11, a plurality of source drivers 12, and a plurality of gate drivers 13 disposed at the surrounding of the display area 11. The source drivers 12 and the gate drivers 13 respectively connect with printed circuit boards 17a and printed circuit boards 17b via respective flexible circuit boards 20. As shown in FIG. 1B, on the panel 10, an area 14 between two source drivers, the driver 12a and the driver 12b which are not cascaded but adjacent to each other, only keeps a few of dummy patterns 16 and an alignment structure 15, providing for circuit assembly of the panel 10 and the flexible circuit board 20.

As shown in FIG. 1C, the alignment structure 15 includes an alignment mark 151. While assembling the panel 10 and the flexible circuit board 20, a positional alignment is examined for the board 20 though a transmissive area 21 which is light-transmissive and the alignment mark 151 on the panel 10. If the alignment mark 151 is properly positioned inside the transmissive area 21, the pads 121 the from source driver 12 are aligned to leads 22 of the flexible circuit board 20. As shown in FIG. 1D, while the location of the transmissive area 21 shifts from that of the mark 151, this means that the location of the pad 121 also shifts from that of the lead 22. However, the degree of assembly shift is not very clear for visual check.

As shown from the layout design in the figure, the edge of every panel 10 is required to keep the alignment mark 151 during a bonding process. Because these alignment marks 151 are located between two drivers and their positions can not be changed arbitrarily under the limitation of manufacturing tools, the space between every two adjacent leads of the drivers can not be effectively utilized for constructing prospective wiring. In particular, the demand in increasing number of contacts for the source drivers can't be met and thereby the pattern design with the WOA on array substrate is greatly limited.

SUMMARY OF THE INVENTION

The object of the present invention is to provide a structure for circuit assembly where the layout between two driver chips is took as a portion of the alignment structure so that consideration to both the design for WOA on array substrate and the improvement of the alignment precision for circuit assembly can be involved.

The structure for circuit assembly in the present invention is applied to the positional alignment for bonding two substrates with different material, such as the bonding of a display panel and a flexible circuit board. The structure for circuit assembly comprises a first substrate having a plurality of first terminals, a second substrate having a plurality of second terminals. Both a first alignment mark and a second alignment mark are included to be located in the vicinity of the first terminals, while a transmissive area located in the vicinity of the second terminals. In the case that the first substrate is bonded with the second substrate, that the edge of the transmissive area is located between the first alignment mark and the second alignment mark, and that the first alignment mark is located outside the transmissive area, then the first terminals are normally connected with the second terminals.

The first alignment mark as above can be a conductive pattern, a wiring, or an ID mark such as chip ID or plate ID, and so on. As to a display panel where the first alignment mark and the second alignment mark are located between two adjacent driver chips, the spacing between the alignment mark and the pattern surrounding the mark provides a novel method for checking the precision of positional alignment as a double-check effect to make sure whether the terminals are aligned and whether the deviation of alignment is within the tolerance. In addition, the utilization of the area between two driver chips for wiring layout can also raise the flexibility of design for WOA on array substrate.

DESCRIPTION OF THE PREFERRED EMBODIMENT

According to accompanying figures attached, the structure for circuit assembly in present invention is illustrated in details, and preferred embodiments are listed and described as following.

Figure 2:
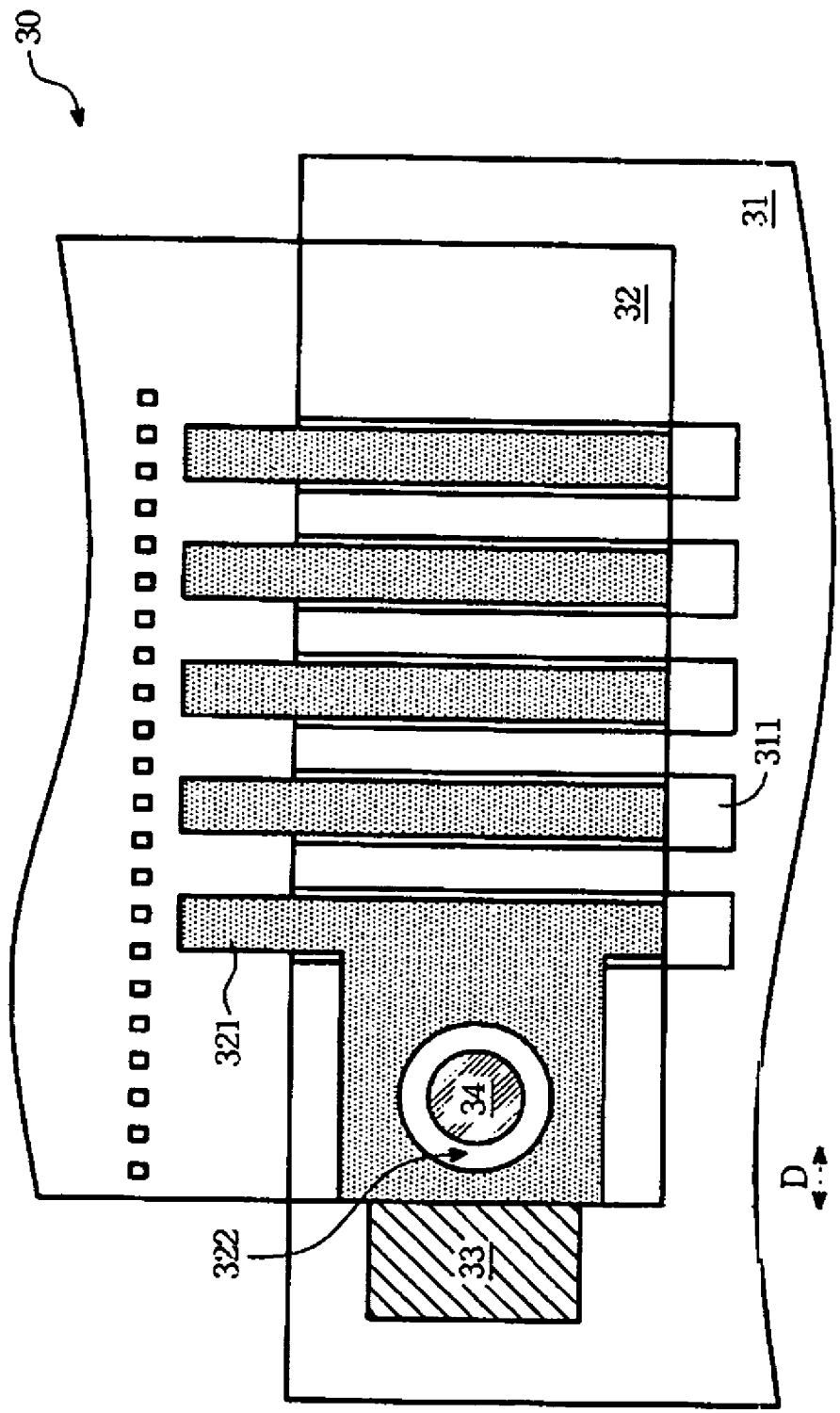
FIG. 2 shows the structure for circuit assembly in the present invention.

Refer to FIG. 2, showing a preferred structure for circuit assembly in accordance with the present invention. The structure 30 for circuit assembly is located on a first substrate 31 and a second substrate 32. The first substrate 31 has a plurality of first terminals 311, a first alignment mark 33 and a second alignment mark 34, both located at the same side where the first terminals 311 are located. The second substrate 32 has a plurality of second terminals 321 and a transmissive area 322, located at the side where the second terminals 321 are located. In the case that the first substrate 31 joins the second substrate 32, that the edge of the transmissive area 322 is located within the distance D between the first alignment mark 33 and the second alignment mark 34, and that the first alignment mark 33 is located outside the transmissive area 322, the first terminals 311 can then contact with the respective second terminals 321.

The structure as above for circuit assembly located at a bonding part of the two boards is applicable to various displays and the like, such as the electronic products having a bonding structure on circuit boards or a bonding structure between a circuit board and a panel. This can lead to a hike in accuracy of the alignment while leads join. In the present invention, the first substrate 31 can be a liquid crystal panel with a thin film transistor array or an organic illuminating panel, where the first terminal 311 can be connected to the driver chip on the panel. The second substrate 32 can be a flexible substrate such as a flexible printed circuit board. The transmissive area 322 can be an empty area without any wire as shown in FIG. 2, or be formed by employing an edge line drawn on the second transparent substrate 32 or by drilling a hole on the second substrate 32. The first alignment mark 33 and the second alignment mark 34 can be light-proof structures of any shape but with a proper distance D in between as a tolerant range for the rim shift of the transmissive area. The first alignment mark 33 can be a conductive pattern, a track of wiring, or an ID mark, which will be described respectively in the following embodiments.

Figure 3A:
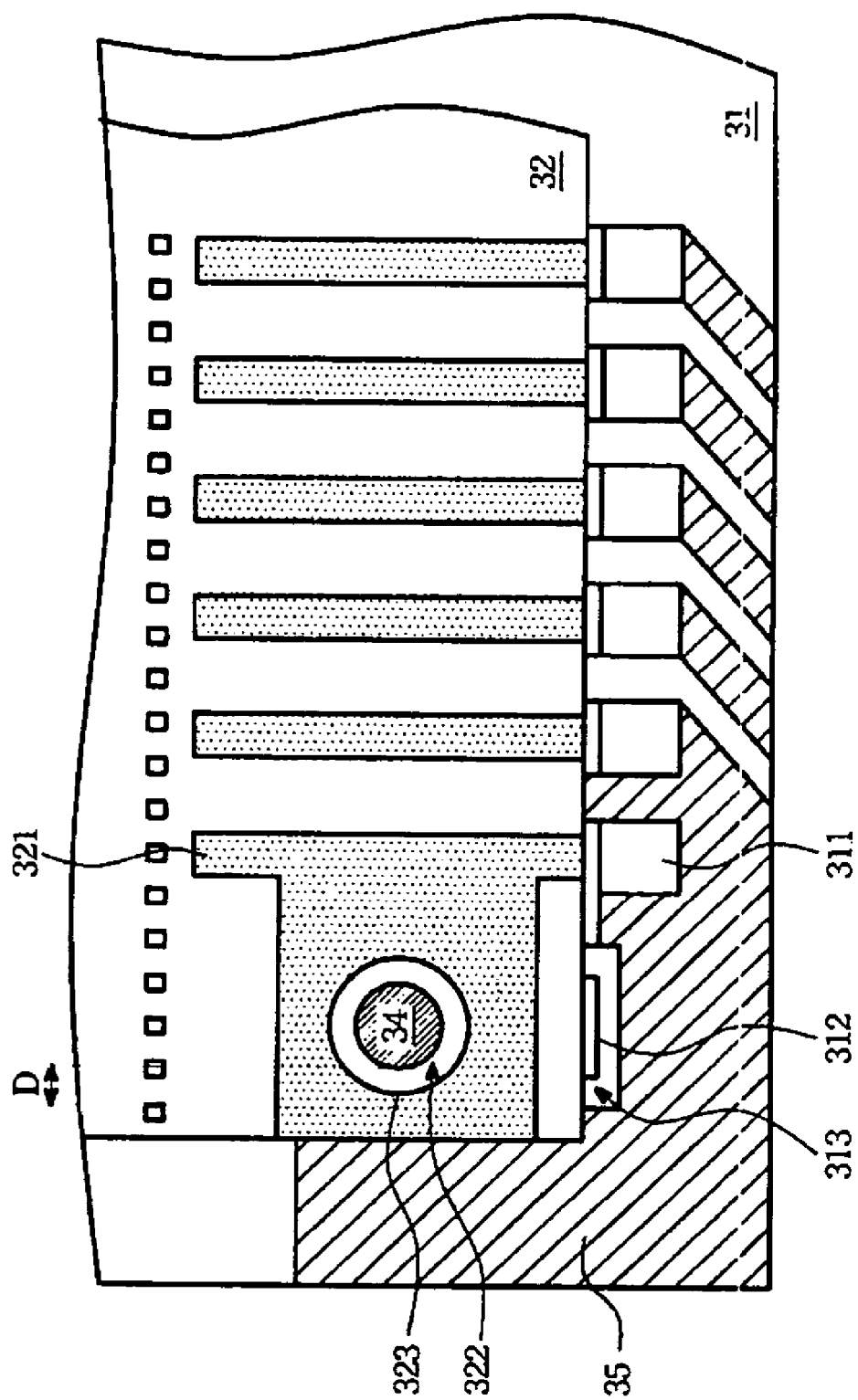
FIG. 3A shows an aligned state of the structure for circuit assembly in the present invention.
Figure 3C:
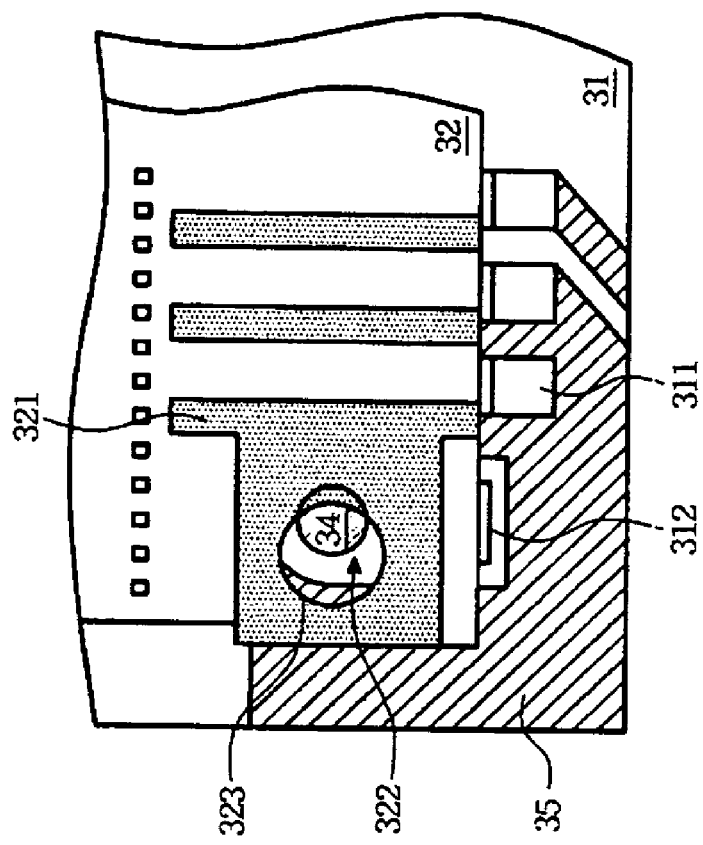
FIG. 3C shows a mis-aligned state of the structure for circuit assembly in the present invention.
Figure 3B:
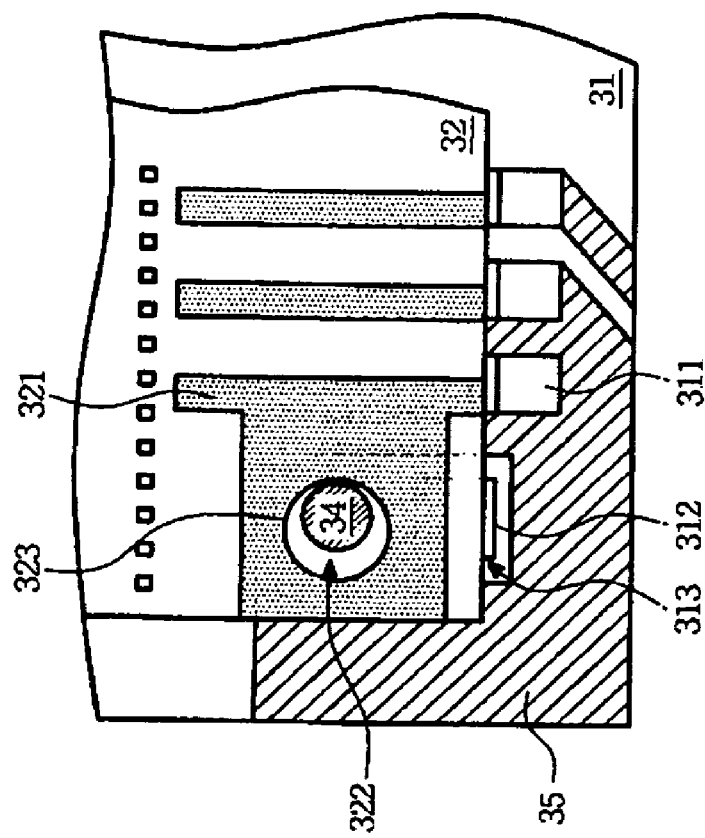
FIG. 3B shows the tolerance of the aligned state of the structure for circuit assembly in the present invention.

Refer to FIGS. 3A-3C, showing embodiments using a conductive pattern as the first alignment mark 33 and illustrating a preferred alignment method in accordance with the present invention. The conductive pattern 35 on the first substrate 31 covers a side area of the first terminal 311 and connects the first terminal 311 but reserving an uncovering area 313. A circular second alignment mark 34 is disposed inside the uncovering area 313 at a distance D from the conductive pattern 35. The transmissive area 322 on the second substrate 32 is also circular for matching the shape of the second alignment 34, while in another preferred embodiment its diameter may be somewhat bigger than that of the circular second alignment mark 34 but smaller than the width of the uncovering area.

As shown in FIG. 3A, in the case that the second substrate 32 joins the first substrate 31, and that the rim 323 of the transmissive area 322 is located at the center of the distance D between the conductive pattern 35 and the second alignment mark 34, it represents that the first terminals 311 are exactly aligned on the second terminals 321. As shown in FIG. 3B, if the rim 323 of the transmissive area 322 is located at the intersection of the conductive pattern 35 and the uncovering area 313, it indicates that the first terminals 311 are not completely aligned on the second terminals 321. This, however, is still within the range of deviation tolerance. As shown in FIG. 3C, when the rim 323 of transmissive area 322 is outside the intersection area of the conductive pattern 35 and the uncovering area 313 and when the rim 323 goes into the cover area of the conductive pattern 35, the first terminals 311 are completely away from the second terminals 321 without any contact, or with only little contact but not reaching the quality requirement of manufacturing.

FIGS. 3A-3C also symbolize an method for the alignment of circuit assembly in accordance with the present invention. Firstly, an anisotropic conductive film (ACF) is adhered onto a plurality of the first terminals 311 in advance while an alignment reference mark 312 can be used for reference. When the second substrate 32 overlaps the first substrate 31, the situation that the rim 323 of the transmissive area 322 falls inside the distance D between the conductive pattern 35 and the second alignment mark 34 is determined so as to verify whether the first terminals 311 and the second terminal 321 are aligned to each other. If the situation in FIG. 3A were met, a thermal clamp is used for bonding the first terminals 311 and the second terminals 321 together by using the anisotropic conductive film. Compared to technologies shown in FIGS. 1C-1D where the conventional technology can only verify whether the leads are aligned, the technology in the present invention can further employ the width of the distance D to specify the tolerant range of alignment deviation, and therefore the effectiveness on double-checks can be obtained.

Figure 4:
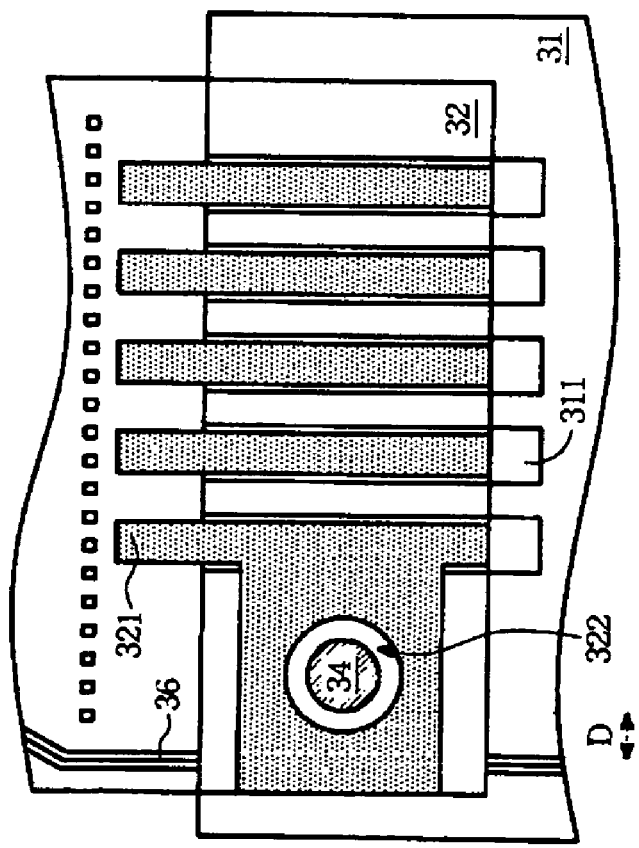
FIG. 4 shows an embodiment using wiring as the first alignment mark.

Refer to FIG. 4, showing an embodiment of the present invention using wiring as first alignment mark 33. The area aside the first terminals 311 can be arbitrarily routed with wires, such as an outer short ring 36 (OSR) in FIG. 4 for preventing from possible electro-static discharge damage. A second alignment mark 34 is located between the ring 36 and the first terminals 311 by a distance D from the ring 36 for providing an alignment check.

Figure 5:
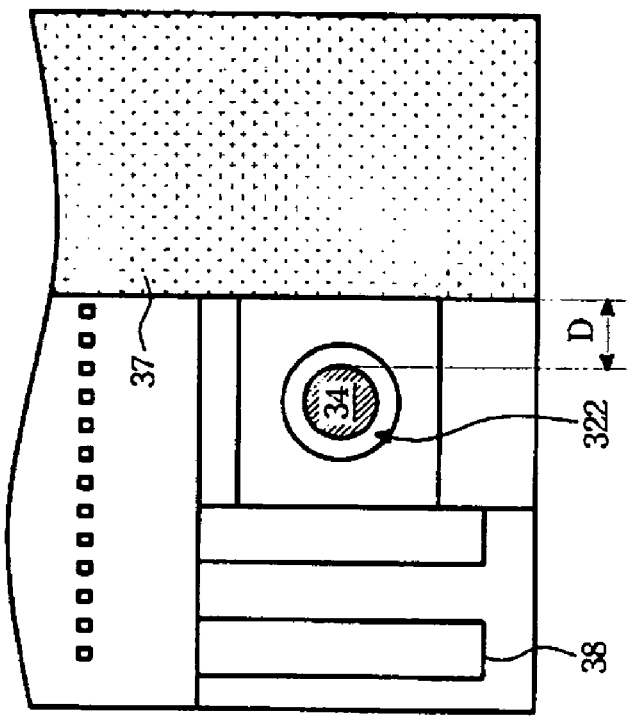
FIG. 5 shows an embodiment using ID mark as the first alignment mark.

Refer to FIG. 5, showing an embodiment of the present invention using ID marks such as Chip IDs, glass Plate IDs and so on as the first alignment marks 33. The second alignment mark 34 can be disposed between a ID mark 37 and a spare dummy leads 38 on the first substrate 31, and the mark 34 is spaced a distance D from the mark 37 for providing an alignment check.

As in the above embodiments, the first alignment mark 33 and the second alignment mark 34 can be made of a metal material such as an aluminum, molybdenum, chromium, any alloy involving the forgoing metals, and so on. The distance D between the first alignment mark 33 and the second alignment mark 34 can be from 50 μm to 150 μm; preferably, 100 μm. The second alignment mark 34 can be a circle mark with a diameter from 150 μm to 250 μm so as to fit the area between the first terminal 311 and the first alignment mark 33. Now the transmissive area 34 is specified with a circle area having a diameter from 250 μm to 350 μm, i.e. having an area larger than that of the second alignment mark. Therefore, the tolerance for aligning the first substrate 31 to the second substrate 32 is about ±50 μm.

Figure 6:
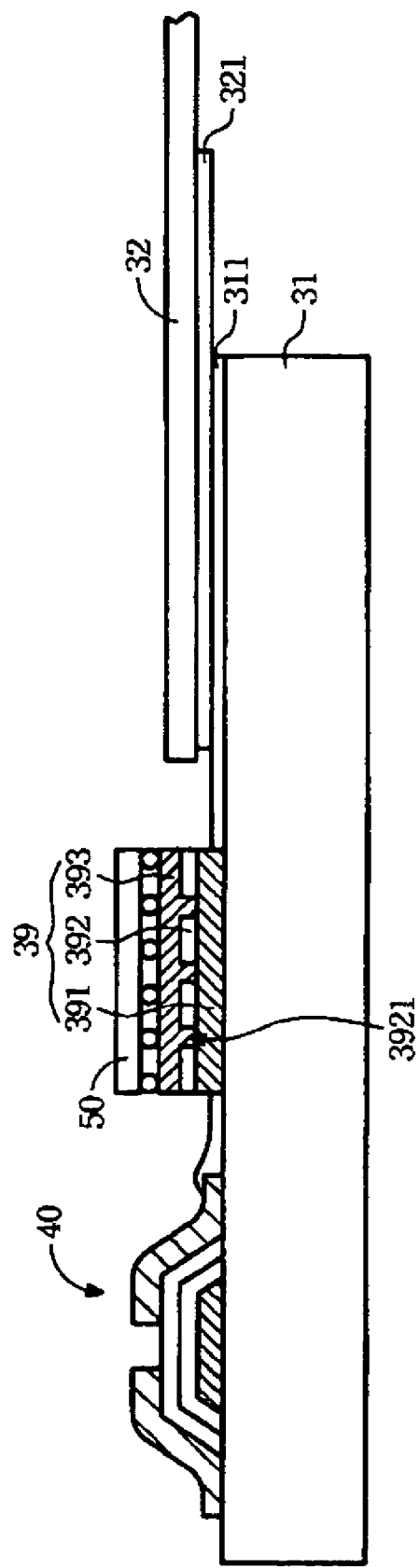
FIG. 6 shows a structure of bonding pads connected with first leads.

Refer to FIG. 6, showing a structure of bonding pad connecting the first terminals in accordance with the present invention. While there are other parts on the first substrate 31, a bonding pad 39 is normally used for connecting the first terminals 311 with those components to provide for transmitting the signals from the second substrate 32 to the components on the first substrate 31. The structure of bonding pad 39 comprises a first conductive layer 391 formed on the first substrate 31 and contacted with the first terminals 311, an dielectric layer 392 located on a first conductive layer 391 and having a via 3921, and a second conductive layer 393 connected with the first conductive layer 391 through the via 3921. The other end of the first conductive layer 391 is connected with a thin film transistor 40 while the second conductive layer 393 is connected with a driver chip 50, a source driver chip or a gate driver chip.

Figure 7A:
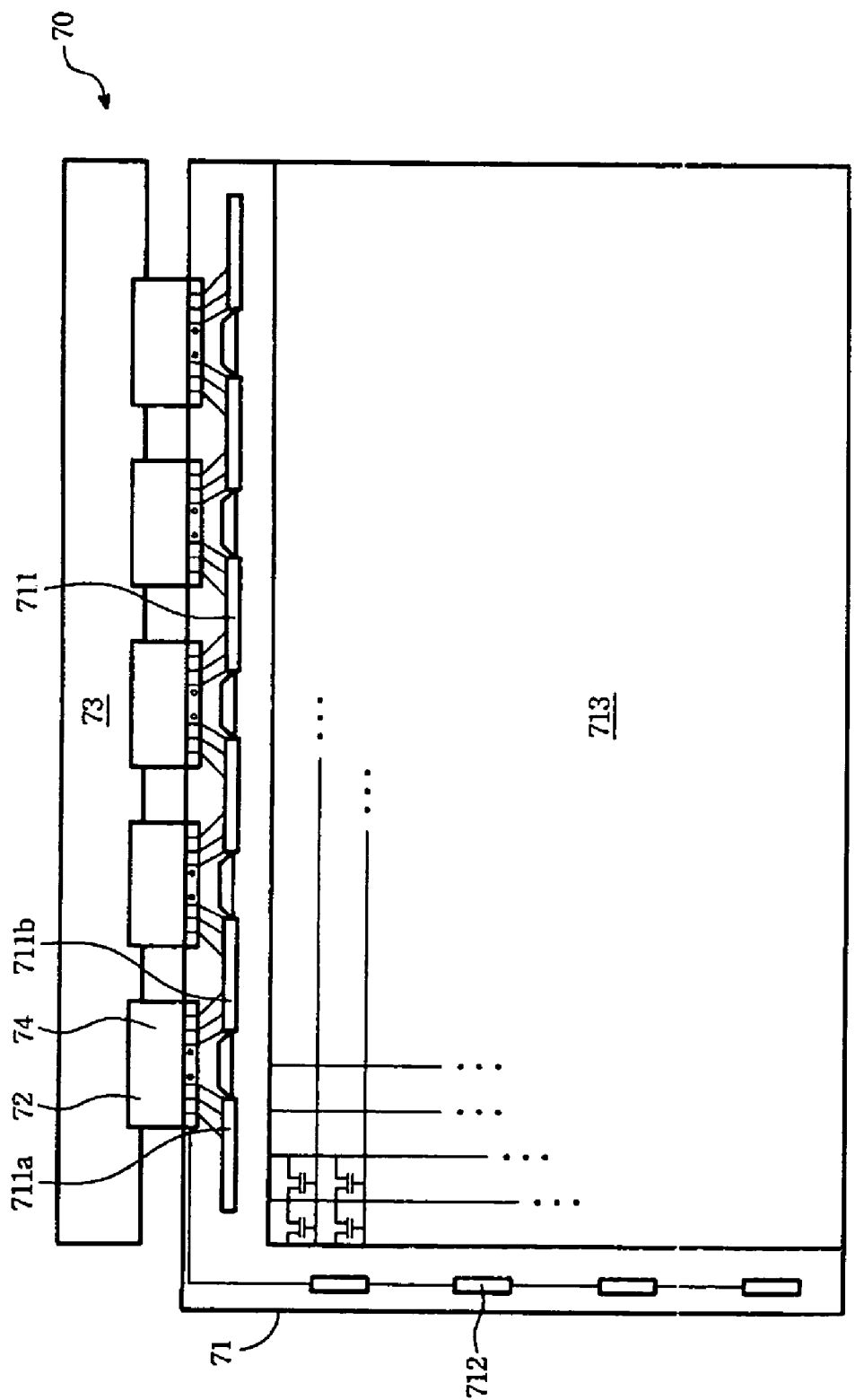
FIG. 7A shows a display panel with the structure for circuit assembly in the present invention.

Refer to FIG. 7A, where a liquid crystal display is used as an instance for illustrating a typical application for the structure for circuit assembly in accordance with the present invention. A liquid crystal display 70 has a liquid crystal panel 71 communicating with a printed circuit board 73 through a flexible circuit board 72. On the liquid crystal panel 71, a plurality of cascaded driver chips are shown to have cascaded source driver chips 711 and cascaded gate driver chips 712. As the example of the source driver chips 711 while referring to FIG. 7B and FIG. 3A, the chips 711 are mounted on the array substrate by using the method of chip on glass bonding (COG), thereafter cascaded by wiring on array (WOA) on the array substrate, and thereby extended to have a plurality of the leads 311. The flexible printed circuit board 72 has a plurality of the second terminals 321 and a transmissive area 322 located in the vicinity of the second terminals 321.

Figure 7B:
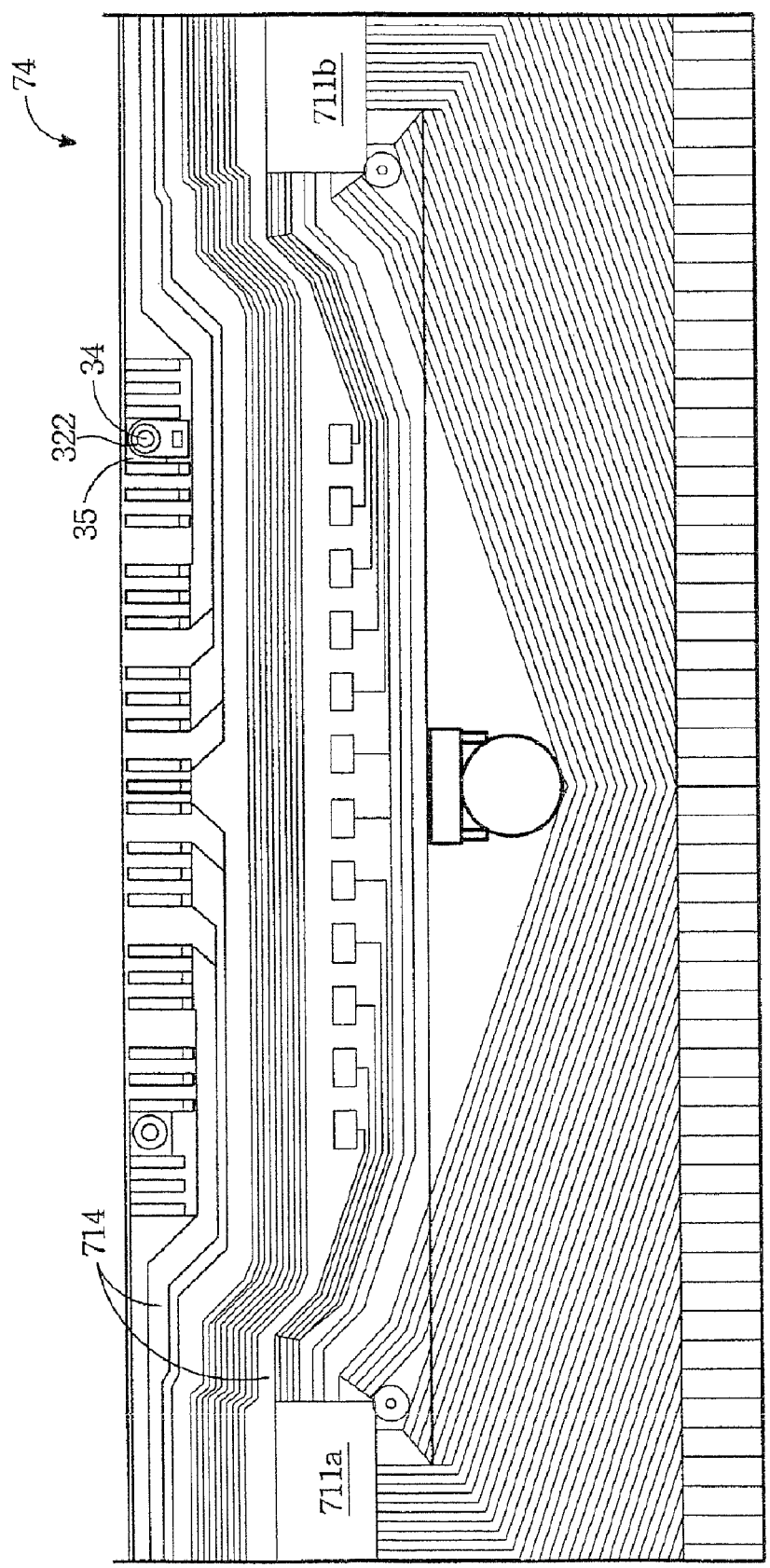
FIG. 7B shows an enlarged view of the bonding portion of the display panel shown in FIG. 7A.

FIG. 7B shows an enlarged view for the junction part 74 of the liquid crystal panel 71 and the flexible circuit board 72. The conductive pattern 35 and the second alignment mark 34 are constructed between two adjacent source driver chips, 711a and 711b. When the bonding pad of the liquid crystal panel 71 overlaps on the flexible circuit board 72, the edge of transmissive area 322 is disposed between the conductive pattern 35 and the second alignment mark 34 so as to have the conductive pattern 35 located outside the transmissive area 322. Upon such an arrangement, the first terminals 311 can align respectively to the second terminals 321.

Figure 1A:
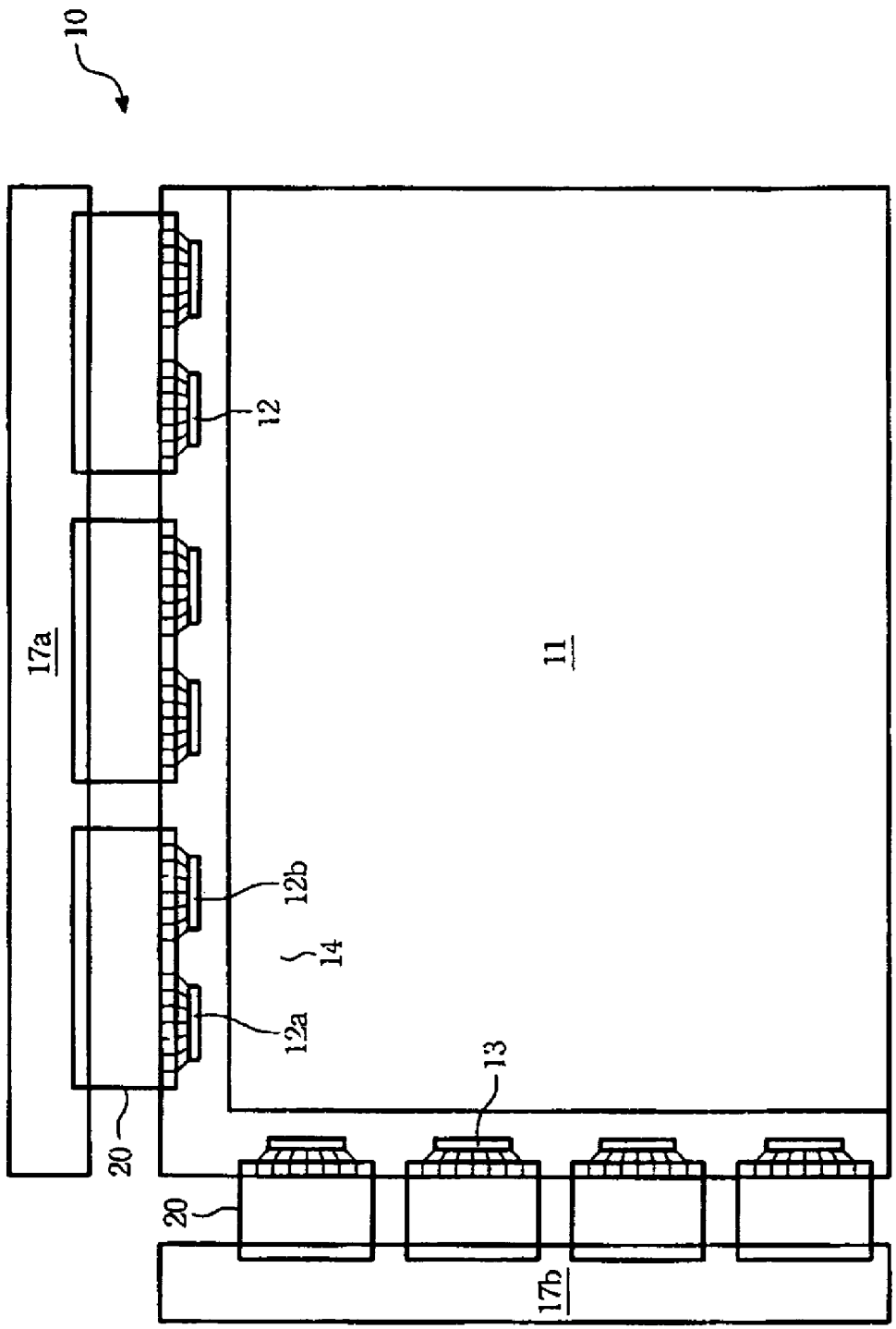
FIG. 1A shows a conventional display panel.
Figure 1B:
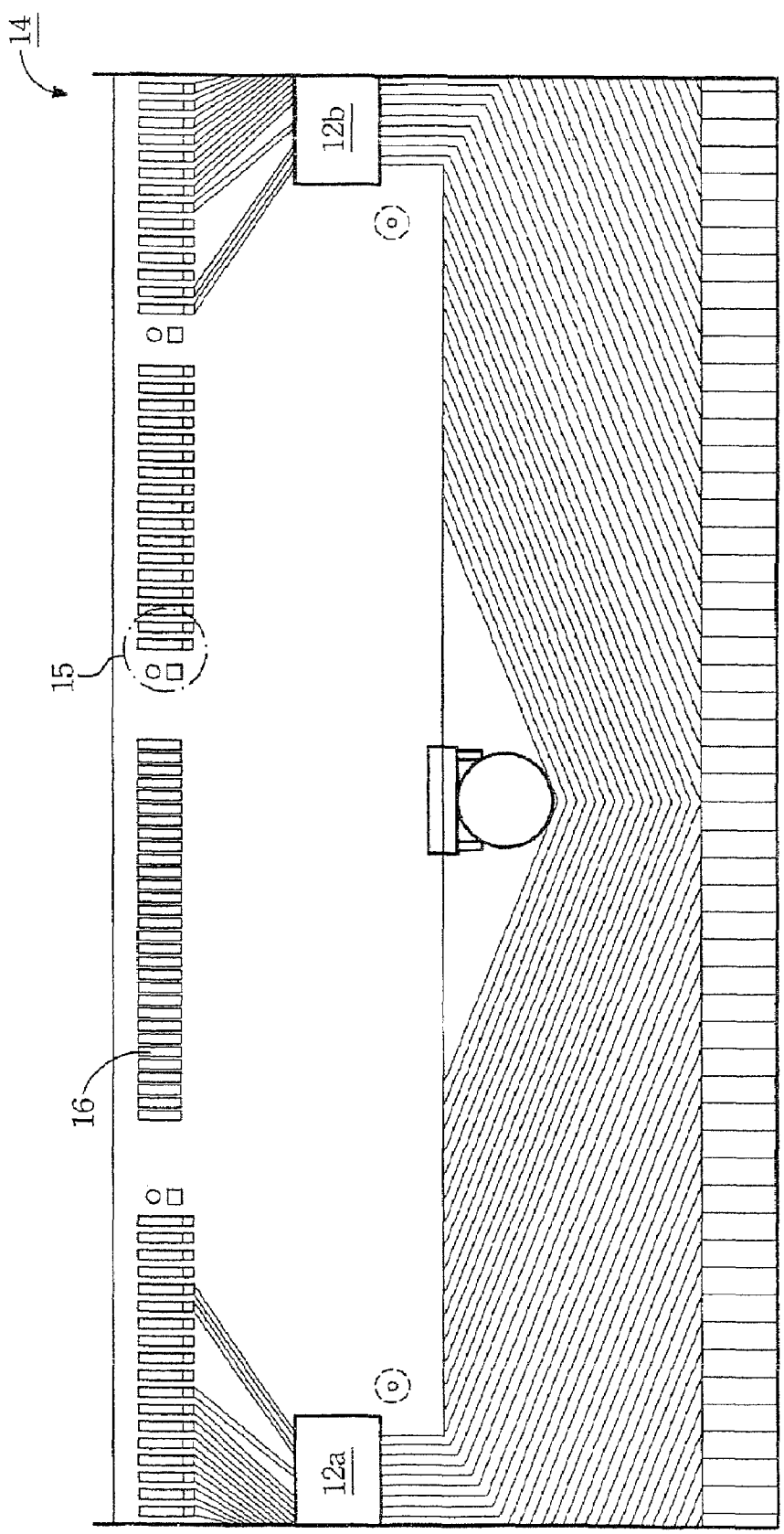
FIG. 1B shows an enlarged view of the bonding portion of FIG. 1A.
Figure 1D:
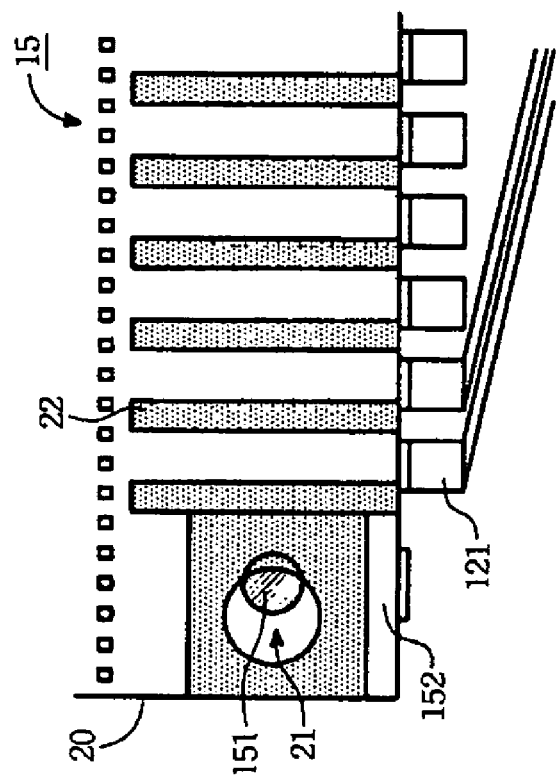
FIG. 1D shows a mis-aligned state of a conventional structure of alignment.
Figure 1C:
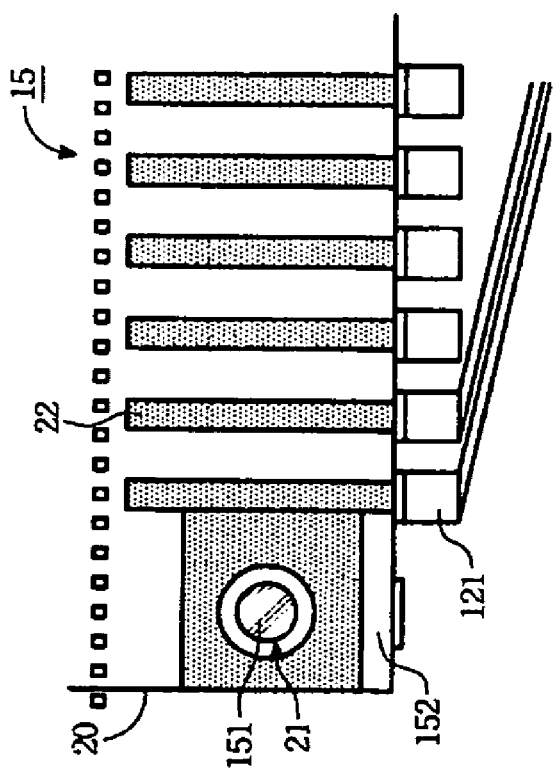
FIG. 1C shows an enlarged view of a conventional structure of alignment.

The comparison between FIG. 7B and FIG. 1B shows that the conductive pattern 35 is a new design for wiring on array substrate where an empty area for avoiding the second alignment mark 34 can be used to relieve the space aside the junction area for further designing a variety of wiring, such as the wiring 714 for cascading driver chips 711a and 711b. Therefore, both the compatibility of the existing manufacturing system and the precision of alignment can be enhanced, and the production cost can be substantially reduced.

The technology of the present invention, while compared to the conventional technology, has the following advantages over the conventional design:
1. No change in the bonding tool for the existing machines is required. Thus, the introduction of new designs for modules can be expedited and the compatibility of manufacturing process can be raised.
2. It increases the accuracy of the alignment check for the fine pitch bonding process.
3. It raises the flexibility of design for wiring on array (WOA) on glass substrate and increases the area for additional wires.
4. Under the situation that the second alignment mark is fixed, the bonding area between two adjacent driver chips can be used for the design of wiring on array (WOA) on the glass substrate.
5. It employs the distance between the alignment mark and its surrounding wires for checking the accuracy of alignment.
6. The effectiveness on double-checks can be assured.

The above detailed description is a substantial illustration for the preferred embodiments of the present invention. However, the embodiments as above should not be construed as limiting the scope of the invention. Any equivalent embodiment or minor modification will not exempt from infringing the object of this present invention and should be included within the scope of patent in this case.

What is claimed is:

1. A structure for a circuit assembly, comprising:
a first substrate having a plurality of first terminals and an array of thin film transistors formed thereon;
a first alignment mark disposed on said first substrate and located in the vicinity of said plurality of first terminals;
a second alignment mark disposed on said first substrate and located in the vicinity of said plurality of first terminals and said first alignment mark, wherein a distance between said first alignment mark and said second alignment mark is ranged from about 50 μm to about 150 μm; and
a second substrate having a plurality of second terminals thereon, and a transmissive area located in the vicinity of said plurality of second terminals;
whereby, when said first substrate is assembled with said second substrate so as to have an edge of said transmissive area located between said two alignment marks and said first alignment mark located outside said transmissive area, said plurality of first terminals are normally connected with said plurality of second terminals.

2. The structure of claim 1, wherein said first alignment mark is a conductive pattern.

3. The structure of claim 2, wherein said conductive pattern is connected to said plurality of first terminals.

4. The structure of claim 1, wherein at least one of said plurality of first terminals is adapted to connect a driver chip.

5. The structure of claim 1, wherein at least one of said first alignment mark and said second alignment mark is made of aluminum, molybdenum, chromium, or alloys thereof.

6. The structure of claim 1, wherein said second alignment mark is circle-shaped and has a diameter ranged from about 150 μm to about 250 μm.

7. The structure of claim 1, wherein said transmissive area is circle-shaped and has a diameter ranged from about 250 μm to about 350 μm.

8. The structure of claim 1, wherein said second substrate is a flexible circuit board.

9. The structure of claim 1, wherein at least one of said plurality of first terminals is a bonding pad having:
a first conductive layer;
a dielectric layer deposited on said first conductive layer and having a via; and
a second conductive layer contacted with said first conductive layer through said via.

10. The structure of claim 1, wherein said first alignment mark is an ID mark.

11. The structure of claim 1, wherein said first alignment mark is a wiring.

12. A structure for circuit assembly, comprising:
a first substrate; a plurality of driver chips in cascade disposed on said first substrate, each driver chip having a plurality of first terminals;
a first alignment mark formed between two adjacent driver chips; a second alignment mark located between said two adjacent driver chips on said first substrate; and
a second substrate having a plurality of second terminals thereon, and a transmissive area located in the vicinity of said second terminals;
whereby, when said first substrate is assembled with said second substrate to have an edge of said transmissive area located between said two alignment marks and further said first alignment mark located outside said transmissive area, said plurality of first terminals are normally connected with said plurality of second terminals.

13. The structure of claim 12, wherein said driver chips comprise a source driver chip.

14. The structure of claim 12, wherein said driver chips comprise a gate driver chip.

15. The structure of claim 12, wherein said transmissive area is larger than said second alignment mark.

16. The structure of claim 12, wherein said first alignment mark is a conductive pattern connected to said two of the plurality of driver chips.

17. A display panel, comprising the structure for circuit assembly of claim 1.

* * * * *